(12) United States Patent
Jou et al.

(10) Patent No.: US 8,324,970 B2
(45) Date of Patent: Dec. 4, 2012

(54) CIRCUIT AND METHOD FOR RADIO FREQUENCY AMPLIFIER

(75) Inventors: Chewn-Pu Jou, Hsinchu (TW);
Fu-Lung Hsueh, Cranbury, NJ (US);
Sally Liu, Hsinchu (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 23 days.

(21) Appl. No.: 12/894,903

(22) Filed: Sep. 30, 2010

(65) Prior Publication Data

US 2011/0090012 A1 Apr. 21, 2011

Related U.S. Application Data

(60) Provisional application No. 61/253,322, filed on Oct. 20, 2009.

(51) Int. Cl.
*H03F 3/04* (2006.01)
(52) U.S. Cl. ........................................ 330/296; 330/307
(58) Field of Classification Search .................. 330/296, 330/285, 307, 277
See application file for complete search history.

(56) References Cited

U.S. PATENT DOCUMENTS

| 5,689,209 | A | * | 11/1997 | Williams et al. | 327/425 |
|---|---|---|---|---|---|
| 5,717,241 | A | | 2/1998 | Malhi et al. | |
| 5,945,726 | A | | 8/1999 | Prall et al. | |
| 6,075,272 | A | | 6/2000 | Forbes et al. | |
| 6,624,493 | B1 | * | 9/2003 | Welch | 257/476 |
| 6,661,277 | B2 | * | 12/2003 | Dabral | 327/534 |
| 7,944,305 | B2 | * | 5/2011 | Knickerbocker et al. | 330/277 |
| 2006/0157791 | A1 | * | 7/2006 | Lee et al. | 257/357 |
| 2010/0090669 | A1 | * | 4/2010 | Latham et al. | 323/282 |

OTHER PUBLICATIONS

Office Action dated Apr. 18, 2012 from corresponding application No. CN 201010517147.X.

* cited by examiner

*Primary Examiner* — Henry Choe
(74) *Attorney, Agent, or Firm* — Lowe Hauptman Ham & Berner, LLP

(57) ABSTRACT

A radio frequency amplifier circuit includes a substrate that is capable of receiving a substrate bias voltage. The source of a transistor is capable of receiving a source bias voltage. The drain of the transistor is capable of receiving a drain bias voltage. The gate of the transistor is located between the source and the drain. A radio frequency input signal is coupled to the gate. A substrate bias circuit provides the substrate bias voltage. The substrate bias voltage and the source bias voltage forward bias the first diode formed by the source and the substrate. The substrate bias voltage and the drain bias voltage reverse bias the second diode formed by the drain and the substrate.

20 Claims, 3 Drawing Sheets

CIRCUIT AND METHOD FOR RADIO FREQUENCY AMPLIFIER

CROSS-REFERENCE TO RELATED APPLICATIONS

The present application claims priority of U.S. Provisional Patent Application Ser. No. 61/253,322, filed on Oct. 20, 2009, which is incorporated herein by reference in its entirety.

TECHNICAL FIELD

This disclosure relates generally to integrated circuits, more particularly to a radio frequency (RF) amplifier.

BACKGROUND

Conventional RF amplifier integrated circuits have limited bandwidth and thermal noise performance because of high input resistance and capacitance. Accordingly, new circuits and methods are desired for RF amplifier integrated circuits.

BRIEF DESCRIPTION OF THE DRAWINGS

For a more complete understanding of the present disclosure, and the advantages thereof, reference is now made to the following descriptions taken in conjunction with the accompanying drawings, in which.

DETAILED DESCRIPTION OF ILLUSTRATIVE EMBODIMENTS

Figure 1:
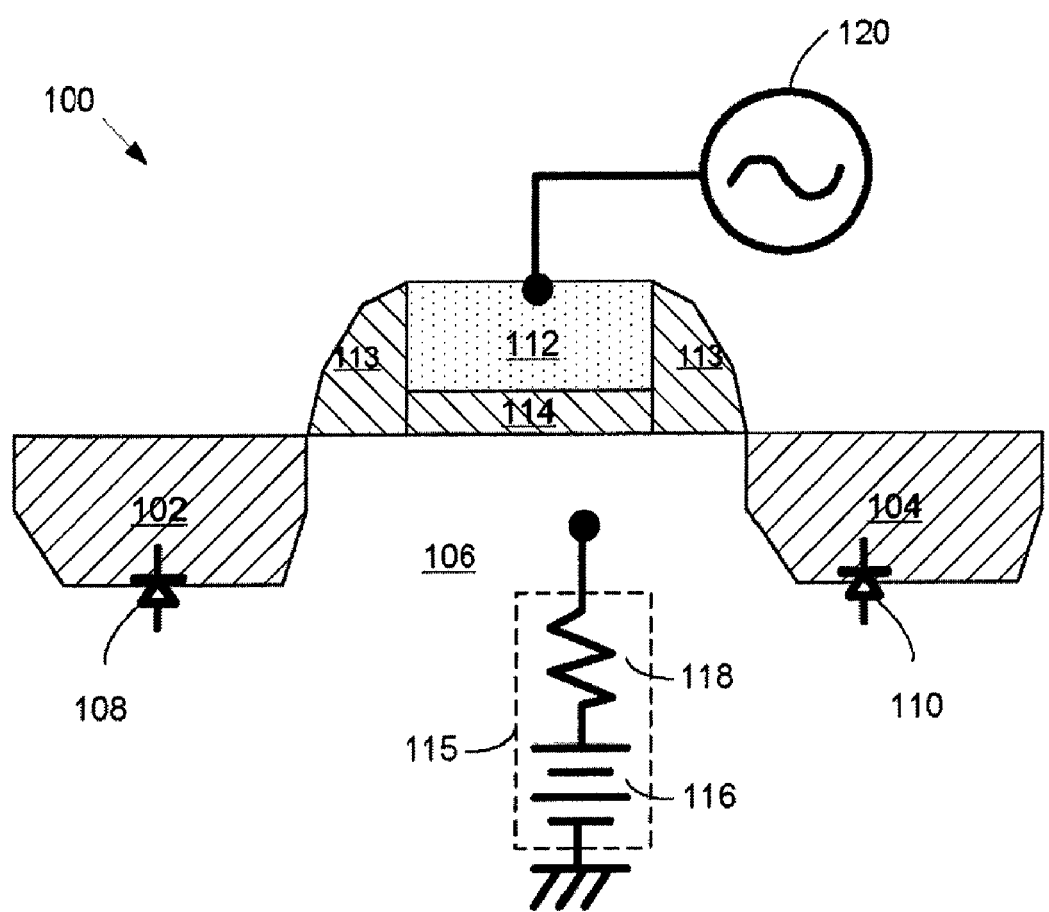
FIG. 1 illustrates one embodiment of a RF amplifier circuit.

The making and using of the presently preferred embodiments are discussed in detail below. It should be appreciated, however, that the present disclosure provides many applicable inventive concepts that can be embodied in a wide variety of specific contexts. The specific embodiments discussed are merely illustrative of specific ways to make and use the invention, and do not limit the scope of the invention.

Radio frequency (RF) amplifier circuits are provided. Throughout the various views and illustrative embodiments of the present invention, like reference numbers are used to designate like elements. For simplifying the illustration, in the drawings, some circuitry symbols are depicted with the exemplary structures of RF amplifiers according the one or more embodiments. Any person or ordinary skill in the art would appreciate that these depicted circuitry symbols are merely illustrative and not intended to show the actual position of the electrical components or elements represented by these circuitry symbols.

FIG. 1 illustrates one embodiment of a RF amplifier circuit. A RF amplifier circuit, e.g., a MOSFET RF amplifier circuit 100, includes a source 102 of a MOSFET, a drain 104 of the MOSFET, a substrate 106, and a gate 112 of the MOSFET, where the gate 112 is connected to a RF input signal 120. In this embodiment, a substrate bias circuit 115 can include a voltage source 116 and a bias resistor 118. The substrate bias circuit 115 can provide a substrate bias voltage for the substrate 106. In FIG. 1, spacers 113, a gate dielectric layer 114, a first diode 108 formed by the source 102 and the substrate 106, and a second diode 110 formed by the drain 104 and the substrate 106 are also shown.

A source bias voltage is applied to the source 102. The source bias voltage and the substrate bias voltage forward bias the first diode 108. A drain bias voltage is applied to the drain 104. The drain bias voltage and the substrate bias voltage reverse bias the second diode 110. The radio frequency input signal 120 is applied to the gate 112 of the MOSFET. The substrate bias circuit 115 provides a bias current to the substrate 106. The bias current in turn flows to the source 102 due to the forward bias between the source 102 and substrate 106.

In one example, the source bias voltage can be coupled to a ground voltage. The MOSFET can be an n-type MOSFET, where the substrate 106 has a p-type dopant, the source 102 has an n-type dopant, and the drain 104 has an n-type dopant. The drain bias voltage can be coupled to a power supply voltage Vdd. The substrate bias voltage can have a value between the source bias voltage and the drain bias voltage. The gate 112 can be coupled to a direct current (DC) voltage that is substantially equal to a sub-threshold voltage of the MOSFET. Using sub-threshold DC bias at the gate 112 saves power for low power applications, e.g. mobile electronics.

In FIG. 1, the MOSFET RF amplifier circuit 100 has a cutoff frequency multiple times higher than that of a conventional RF amplifier integrated circuit by reducing the input resistance and capacitance. For example, for a conventional lateral bipolar junction transistor (BJT) RF amplifier circuit where the RF input signal is in an N-well region, the N-well has a large junction capacitance with the substrate (p-type) that limits the cutoff frequency. In comparison, the MOSFET RF amplifier circuit 100 in FIG. 1 has much less input capacitance. Its thermal noise performance is also improved, because the RF input signal 120 is coupled to the gate 112 instead of highly resistive substrate 106, thus reducing thermal noise.

Also, the MOSFET RF amplifier circuit 100 has a lower flicker noise compared to conventional MOSFET operation mode where the current concentrate at an inversion region near the surface of a channel. Flicker noise is a type of electronic noise with a $1/f$ spectrum, where $f$ is the frequency. It results from a variety of effects, such as impurities in a conductive channel. The MOSFET RF amplifier circuit 100 has a current distribution pattern away from the surface of the channel. By avoiding the flicker noise arising from surface trap states, the MOSFET RF amplifier circuit 100 shows a lower flicker noise level about 1~2 order of magnitude less than conventional MOSFET operation mode. If a sub-threshold DC bias is applied at the gate 112, the reduced direct current can also decrease the flicker noise.

Figure 2:
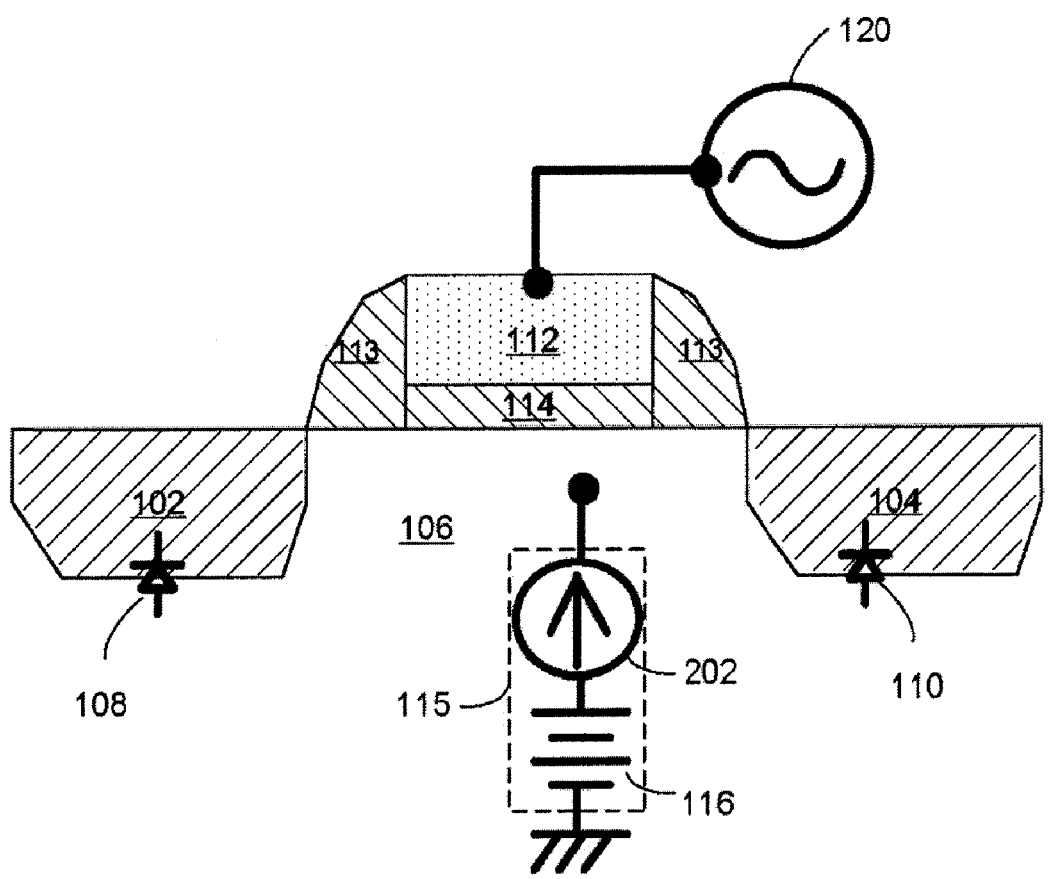
FIG. 2 illustrates another embodiment of a RF amplifier circuit.

FIG. 2 illustrates another embodiment of a RF amplifier circuit. In FIG. 2, the bias resistor 118 in FIG. 1 is replaced by a current source 202 to control the bias current provided by the substrate bias circuit 115 to the substrate 106. The current source 202 can include any suitable current source circuit that controls the bias current provided to the substrate 106. The other elements of the circuit in FIG. 2 are similar to the circuit shown in FIG. 1. In FIG. 2, the substrate bias voltage is coupled to the substrate 106 through the current source 202 that provides a bias current to the substrate 106. The bias current in turn flows to the source 102 due to the forward bias between the source 102 and substrate 106.

Figure 3:
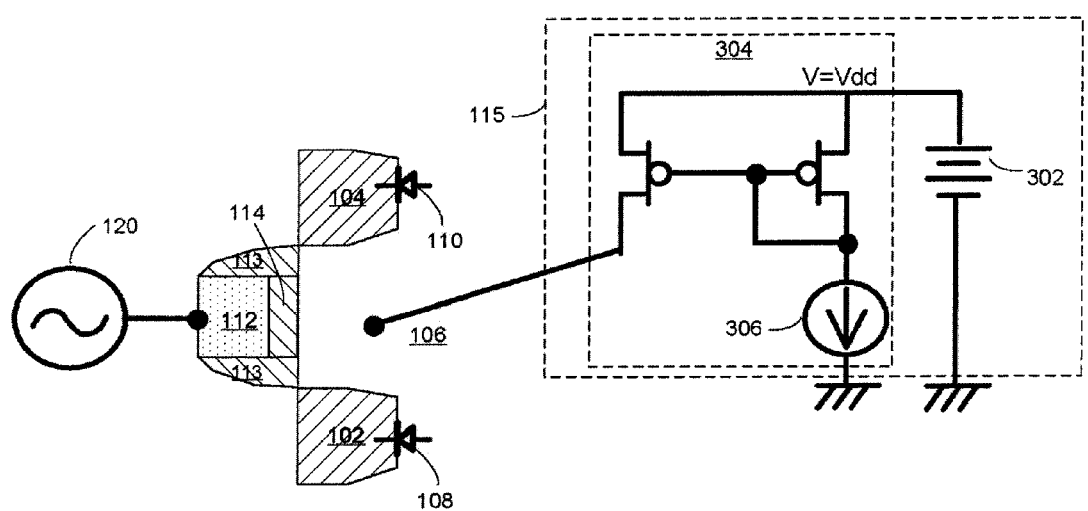
FIG. 3 illustrates yet another embodiment of a RF amplifier circuit.

FIG. 3 illustrates yet another embodiment of a RF amplifier circuit. In FIG. 3, the substrate bias circuit 115 includes a current mirror circuit 304 that controls the bias current being provided to the substrate 106. A voltage source 302 providing a power supply voltage Vdd is connected to the current mirror circuit 304. The current mirror circuit 304 copies the current through the current source 306 to provide a bias current to the substrate 106. The other elements of the circuit in FIG. 3 are similar to the circuit shown in FIG. 1. In FIG. 3, the substrate bias voltage is coupled to the substrate 106 through the current mirror circuit 304 that provides the bias current to the substrate 106. The bias current in turn flows to the source 102 due to the forward bias between the source 102 and substrate 106. A skilled person in the art will appreciate that there can be many embodiment variations of this invention.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for biasing a radio frequency amplifier using a transistor, comprising:
    applying a substrate bias voltage to a substrate of the transistor through a current source circuit;
    applying a source bias voltage to a source of the transistor that forward biases a first diode formed by the source and the substrate of the transistor;
    applying a drain bias voltage to a drain of the transistor that reverse biases a second diode formed by the drain and the substrate of the transistor; and
    applying a radio frequency input signal to a gate of the transistor.

2. The method of claim 1, further comprising coupling the source bias voltage to a ground voltage wherein the substrate has a p-type dopant, the source has an n-type dopant, and the drain has an n-type dopant.

3. The method of claim 1, further comprising coupling the drain bias voltage to a power supply voltage.

4. The method of claim 1, wherein the substrate bias voltage has a value between the source bias voltage and the drain bias voltage.

5. The method of claim 1, further comprising coupling the gate to a direct current voltage that is substantially equal to a sub-threshold voltage of the transistor.

6. The method of claim 1, wherein applying the substrate bias voltage to the substrate through a current source circuit includes providing a bias current to the substrate through a current minor circuit.

7. A radio frequency amplifier circuit, comprising:
    a transistor comprising:
        a substrate, the substrate capable of receiving a substrate bias voltage;
        a source of the transistor, the source capable of receiving a source bias voltage;
        a drain of the transistor, the drain capable of receiving a drain bias voltage; and
        a gate of the transistor that is located between the source and the drain, wherein a radio frequency input signal is coupled to the gate; and
    a substrate bias circuit coupled with the transistor, the substrate bias circuit comprising a current source circuit that provides a bias current to the substrate, the substrate bias circuit providing the substrate bias voltage, wherein the substrate bias voltage and the source bias voltage forward bias a first diode formed by the source and the substrate, and the substrate bias voltage and the drain bias voltage reverse bias a second diode formed by the drain and the substrate.

8. The circuit of claim 7, wherein the substrate has a p-type dopant, the source has an n-type dopant, and the drain has an n-type dopant.

9. The circuit of claim 7, wherein the source bias voltage is a ground voltage.

10. The circuit of claim 7, wherein the drain bias voltage is a power supply voltage.

11. The circuit of claim 7, wherein the substrate bias voltage has a value between the source bias voltage and the drain bias voltage.

12. The circuit of claim 7, wherein the gate is coupled to a direct current voltage that is substantially equal to a sub-threshold voltage of the transistor.

13. The circuit of claim 7, wherein the current source circuit comprises a current minor circuit that provides a bias current to the substrate.

14. A method for biasing a radio frequency amplifier using an n-type MOSFET, comprising:
    applying a source bias voltage to a source of the n-type MOSFET that forward biases a first diode formed by the source and a substrate of the n-type MOSFET;
    applying a drain bias voltage to a drain of the n-type MOSFET that reverse biases a second diode formed by the drain and the substrate;
    applying a substrate bias voltage to the substrate by injecting a bias current to the substrate through a current source circuit, wherein the substrate bias voltage has a value between the source bias voltage and the drain bias voltage; and
    applying a radio frequency input signal to a gate of the n-type MOSFET.

15. The method of claim 14, further comprising coupling the drain bias voltage to a power supply voltage.

16. The method of claim 14, further comprising coupling the gate to a direct current voltage that is substantially equal to a sub-threshold voltage of the n-type MOSFET.

17. The method of claim 14, wherein applying the substrate bias voltage to the substrate by injecting a bias current to the substrate through a current source circuit comprises injecting a bias current to the substrate through a current minor circuit.

18. The method of claim 1, further comprising:
    reducing a flicker noise by applying a direct current voltage to the gate, wherein the direct current voltage is below a threshold voltage of the transistor.

19. The method of claim 1, wherein applying a substrate bias voltage to a substrate of the transistor comprises applying a bias voltage to a metal-oxide-semiconductor field effect transistor (MOSFET).

20. The circuit of claim 7, wherein the transistor is a metal-oxide-semiconductor field effect transistor (MOSFET).

* * * * *